United States Patent [19]
Veit et al.

[11] Patent Number: 5,598,128
[45] Date of Patent: Jan. 28, 1997

[54] OPERATIONAL AMPLIFIER WITH HIGH COMMON MODE REJECTION

[75] Inventors: Werner Veit, Unterhaching; Robert-Grant Irvine, München, both of Germany

[73] Assignee: Siemens Aktiengesellschaft, Munich, Germany

[21] Appl. No.: 435,322

[22] Filed: May 5, 1995

[30] Foreign Application Priority Data

May 5, 1994 [DE] Germany .................... 44 15 953.6

[51] Int. Cl.$^6$ .................................................. H03F 3/45
[52] U.S. Cl. ........................ 330/252; 330/257; 330/258
[58] Field of Search .................................. 330/252, 257, 330/258, 310, 311

[56] References Cited

U.S. PATENT DOCUMENTS

| | | | |
|---|---|---|---|
| 3,582,802 | 1/1971 | Weekes et al. | 330/258 |
| 5,254,956 | 10/1993 | Nishijima | 330/258 |
| 5,298,809 | 3/1994 | Yamaguchi | 330/258 X |

FOREIGN PATENT DOCUMENTS

| | | |
|---|---|---|
| 0516423 | 12/1992 | European Pat. Off. . |
| 9207812 | 10/1992 | Germany . |

*Primary Examiner*—Steven Mottola
*Attorney, Agent, or Firm*—Herbert L. Lerner; Laurence A. Greenberg

[57] ABSTRACT

An operational amplifier includes a symmetrical end stage being formed of emitter followers. The end stage has output terminals forming outputs of the operational amplifier and has input terminals. A voltage divider is connected between the output terminals of the end stage and has a tap. A first differential amplifier stage has input terminals forming symmetrical inputs of the operational amplifier and has output terminals each being coupled to a respective one of the input terminals of the end stage. Loads each terminate a respective one of the output terminals of the first differential amplifier stage. Two second parallel-connected differential amplifier stages each have a first input terminal connected to a reference potential, a second input terminal connected to the tap of the voltage divider, and an output terminal each being coupled to a respective one of the loads.

2 Claims, 1 Drawing Sheet

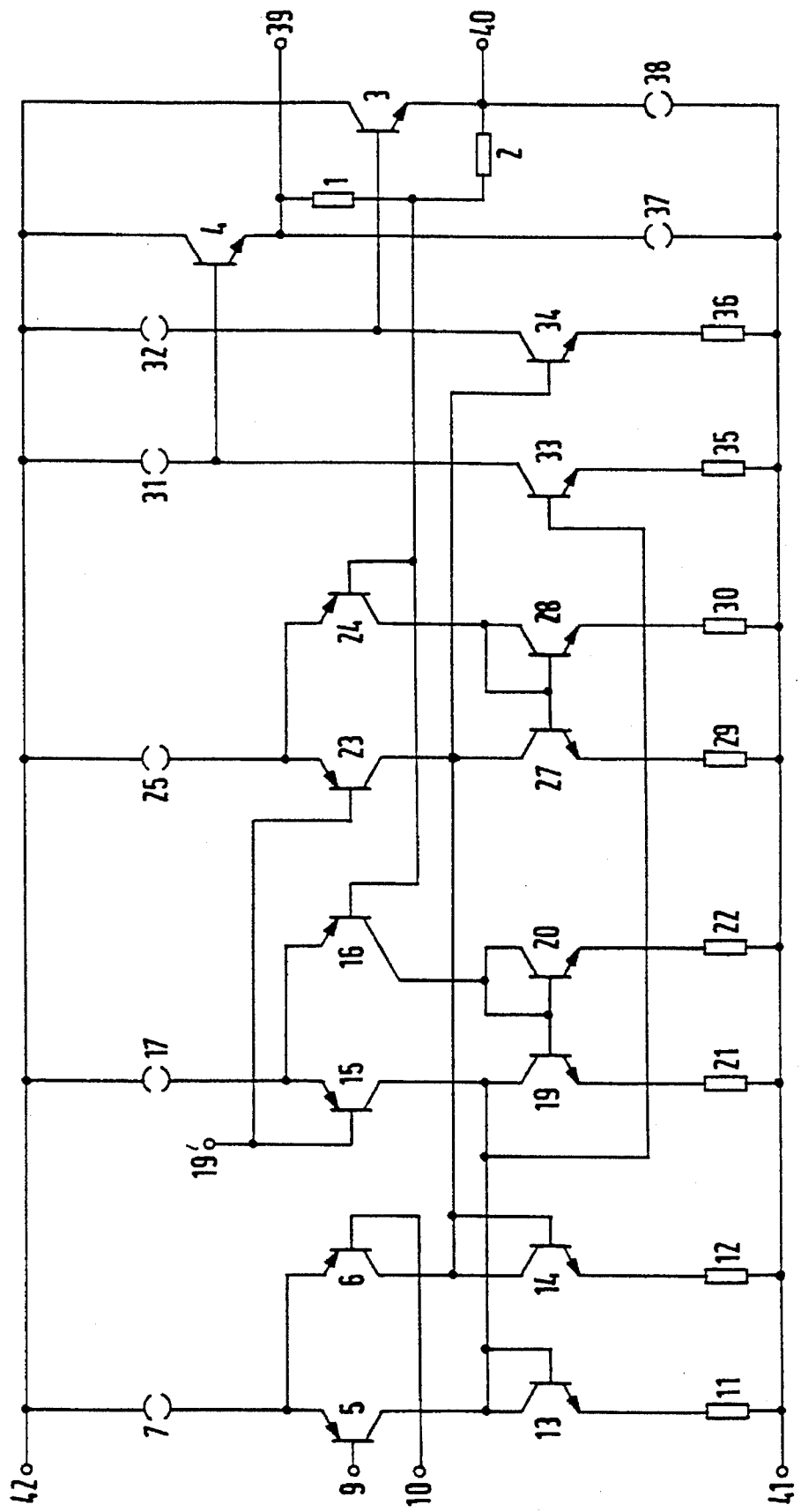

OPERATIONAL AMPLIFIER WITH HIGH COMMON MODE REJECTION

BACKGROUND OF THE INVENTION

Field of the Invention

The invention relates to an operational amplifier with symmetrical inputs and symmetrical outputs.

Such operational amplifiers are supplied with symmetrical input signals, that is input signals which agree in amount but have a different sign with respect to a reference value. The output signals present at the symmetrical outputs of such an operational amplifier should accordingly have the same amplitudes with opposite signs. That means that the total of both signals should always be equal to zero as much as possible, which is equivalent to maximum common mode rejection.

One such operational amplifier is known from German Utility Model G 92 07 812.5. The circuit configuration described therein is constructed for a supply voltage of 4.5 V minimum. However, modern circuit configurations, especially for use in automobiles, require a minimum supply voltage of 2.7 V. Since the known amplifier circuit is constructed for 4.5 V, it contains cascodes for high idling amplification, as well as low-impedance push-pull output buffer amplifiers. Those circuit elements are a hindrance to operation at 2.7 V, because the configuration adds up to as many as four diode threshold voltages.

SUMMARY OF THE INVENTION

It is accordingly an object of the invention to provide an operational amplifier that has a lower supply voltage with high common mode rejection, which overcomes the hereinafore-mentioned disadvantages of the heretofore-known devices of this general type.

With the foregoing and other objects in view there is provided, in accordance with the invention, an operational amplifier, comprising a symmetrical end stage being formed of emitter followers, the end stage having output terminals forming outputs of the operational amplifier and having input terminals; a voltage divider being connected between the output terminals of the end stage and having a tap; a first differential amplifier stage having input terminals forming symmetrical inputs of the operational amplifier and having output terminals each being coupled to a respective one of the input terminals of the end stage; loads each terminating a respective one of the output terminals of the first differential amplifier stage; and two second parallel-connected differential amplifier stages each having a first input terminal connected to a reference potential, a second input terminal connected to the tap of the voltage divider, and an output terminal each being coupled to a respective one of the loads.

In accordance with another feature of the invention, there are provided two current mirrors having input circuits forming the loads and having output circuits each being connected to a respective one of the input terminals of the end stage, and current sources each being connected to a respective one of the output circuits of the current mirrors.

In accordance with a further feature of the invention, there are provided further current mirrors each having an output circuit connected parallel to the loads, the second parallel-connected differential amplifiers having output circuits, and each of the further current mirrors being connected in the output circuit of a respective one of the second parallel-connected differential amplifiers.

In accordance with an added feature of the invention, at least one of the differential amplifier stages has an emitter-coupled pair of bipolar transistors supplied from a current source.

In accordance with a concomitant feature of the invention, the current source is formed by a current bank.

Particularly for filter applications at low frequencies, it is advantageously possible to dispense with the cascode stage, and to replace the push-pull buffer amplifiers with emitter followers, without any loss in performance.

Other features which are considered as characteristic for the invention are set forth in the appended claims.

Although the invention is illustrated and described herein as embodied in an operational amplifier with high common mode rejection, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE of the drawing is a schematic circuit diagram of the operational amplifier according to the invention.

DESCRIPTION OF THE PREFERRED EMBODIMENTS

Referring now to the single FIGURE of the drawing in detail, there is seen an operational amplifier which is shown as an exemplary embodiment and which has two emitter followers 3, 4 provided as a symmetrical end stage. The emitter followers 3, 4 have emitters that are each connected to a respective output terminal 40, 39 which form outputs of the operational amplifier. These emitter followers replace the known push-pull output buffer amplifiers. A voltage divider including two series-connected resistors 1, 2 is connected between output terminals of the two emitter followers 3, 4. The resistors 1, 2 have identical resistances, so that the division factor of the voltage divider is equal to 0.5. Besides the resistive voltage division shown, voltage dividers with inductive or capacitive components may also be provided in some applications, especially for frequency compensation. Each of the emitter followers 3, 4 is connected on the emitter side through a respective current source 38, 37 to a negative first supply voltage terminal 41. Collectors of the emitter followers 3, 4 are each connected to a positive second supply voltage terminal 42. Base terminals of the two emitter followers 3, 4 are each coupled to the positive supply potential 42 through a respective current source 32, 31 and are also connected to a collector of a respective npn transistor 34, 33. Emitters of the two transistors 33, 34 are each carried to the negative supply potential 41 through a respective resistor 35, 36. The bases of the two transistors 33, 34 are each connected to a base and a collector of a respective npn transistor 13, 14. The npn transistors 13, 14 have emitters which in turn are each connected through a respective resistor 11, 12 to the negative supply potential 41. The interconnected bases and collectors of the npn transistors 13, 14 are each also connected to a collector of a respective pnp transistor 5, 6. Collectors of the two pnp transistors 5, 6 are connected both to one another and through a current source 7 to the positive supply potential 42.

The collector of the pnp transistor 5 is also connected to collectors of a pnp transistor 15 and an npn transistor 19. A pnp transistor 16 is connected parallel to the transistor 15, and it has a collector which is connected to an npn transistor 20. Emitters of the transistors 19 and 20 are each connected through a respective resistor 21, 22 to the negative supply potential 41. Base terminals of the npn transistors 19, 20 are connected to one another and to the collector of the transistor 20. Emitters of the pnp transistors 15, 16 are connected to one another and through a current source 17 to the positive supply potential 42. A reference potential 19' is present at a base of the pnp transistor 15.

The base of the pnp transistor 15 is also connected to a base of a further pnp transistor 23. A base of the transistor 16 is likewise coupled to a base of a further pnp transistor 24. Emitters of the transistors 23 and 24 are coupled to one another and through a current source 25 to the positive supply potential 42. A collector of the transistor 23 is connected on one hand to the collector of the transistor 14 and on the other hand to a collector of a further npn transistor 27. A collector of the pnp transistor 24 is coupled to a collector of a further npn transistor 28. Base terminals of the npn transistors 27 and 28 are connected to one another and to the collector of the transistor 28. Emitter terminals of the transistors 27 and 28 are each coupled through a respective resistor 29 and 30 to the negative supply potential 41. Finally, a base of the pnp transistor 16 is connected to a node point forming a tap of the voltage divider, between the resistors 1 and 2.

In the operational amplifier according to the invention, a mean value of the symmetrical voltage present at the outputs 39, 40 is formed by means of the voltage divider. This mean value is compared with a reference value at the input terminal 19', in two second parallel-connected differential amplifier stages respectively formed of the elements 15–22 and 23–30. In the present exemplary embodiment, one of these differential amplifier stages essentially includes the two pnp transistors 15, 16 and the associated current source 17. The other parallel-connected amplifier stage includes the two pnp transistors 23, 24 and the associated current source 25.

A first differential amplifier stage which is, for instance, equivalent to that described above and is formed essentially by the pnp transistors 5, 6 and the current source 7, is supplied with a symmetrical input signal through inputs 9, 10. This differential amplifier stage is terminated by a load. The load is formed in the present case by two current mirrors, each of which is coupled to one output terminal of the first differential amplifier stage. The two current mirrors each form one load that terminates the actual differential amplifier output. This load on one hand is a current mirror having the npn transistors 13, 33 and the resistors 11, 35, and on the other is a current mirror having the npn transistors 14, 34 and the resistors 12, 36. Besides generating the load, the two current mirrors moreover serve in combination with the current sources 31, 32 to provide signal decoupling for the two emitter followers 3, 4, and the transistors 33 and 34 invert and amplify the signals through the loads. The second differential amplifier stage is then coupled to one current branch of each of the two parallel-connected differential amplifier stages. One current branch of the first differential amplifier stage acts upon one of the two parallel-connected differential amplifiers. For that purpose, the current flowing through the pnp transistor 5 or 6 is fed into the input circuit of the respective current mirrors.

The first differential amplifier stage, like the two parallel-connected differential amplifier stages, has emitter-coupled pnp transistors 5, 6 and 15, 16; 23, 24, respectively, the supply currents of which are each supplied through one current source 7, 8, 17, 18, 25, 36. Preferably, the current sources 7, 8, 17, 18, 25, 26 and the current sources 31, 32 can form a current bank in a known manner.

The basic mode of operation of the operational amplifier, which according to the invention is fully differential, is also identical to that described in German Utility Model G 92 07 812.5, but it can be operated with a substantially lower supply voltage.

We claim:

1. An operational amplifier, comprising:
    a symetrical end stage being formed of emitter followers, said end stage having output terminals forming outputs of the operational amplifier and having input terminals;
    a voltage divider being connected between said output terminals of said end stage and having a tap;
    a first differential amplifier stage having input terminals forming symmetrical inputs of the operational amplifier and having output terminals each being coupled to a respective one of said input terminals of said end stage;
    loads each terminating a respective one of said output terminals of said first differential amplifier stage;
    two second parallel-connected differential amplifier stages each having a first input terminal connected to a reference potential, a second input terminal connected to said tap of said voltage divider, and an output terminal each being coupled to a respective one of said loads; and
    two current mirrors having input circuits forming said loads and having output circuits each being connected to a respective one of said input terminals of said end stage, and current sources each being connected to a respective one of said output circuits of said current mirrors.

2. The operational amplifier according to claim 1, including further current mirrors each having an output circuit connected parallel to said loads, said second parallel-connected differential amplifiers having output circuits, and each of said further current mirrors being connected in said output circuit of a respective one of said second parallel-connected differential amplifiers.

* * * * *